(12) United States Patent
Kuramoto et al.

(10) Patent No.: US 10,290,778 B2
(45) Date of Patent: May 14, 2019

(54) SEMICONDUCTOR DEVICE HAVING SEMICONDUCTOR ELEMENT BONDED TO BASE BODY BY ADHESIVE MEMBER

(71) Applicant: NICHIA CORPORATION, Anan-shi (JP)

(72) Inventors: Masafumi Kuramoto, Tokushima (JP); Toshifumi Imura, Anan (JP); Tomoki Tanisada, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/684,468

(22) Filed: Apr. 13, 2015

(65) Prior Publication Data

US 2015/0295153 A1    Oct. 15, 2015

(30) Foreign Application Priority Data

Apr. 14, 2014 (JP) ................................. 2014-082735
Mar. 26, 2015 (JP) ................................. 2015-065053

(51) Int. Cl.
*H01L 23/29* (2006.01)
*H01L 33/56* (2010.01)
(Continued)

(52) U.S. Cl.
CPC .......... *H01L 33/508* (2013.01); *H01L 23/295* (2013.01); *H01L 24/29* (2013.01); *H01L 33/52* (2013.01); *H01L 33/56* (2013.01); *H01L 24/48* (2013.01); *H01L 24/73* (2013.01); *H01L 2224/2929* (2013.01);
(Continued)

(58) Field of Classification Search
CPC ....... H01L 23/295; H01L 33/52; H01L 33/56; H01L 21/563
See application file for complete search history.

(56) References Cited

U.S. PATENT DOCUMENTS 6,049,038 A *  4/2000  Suzuki .................. H01L 21/563
                                                        174/539
8,007,627 B2 *  8/2011  Nishida .................... H01L 24/13
                                                        156/306.6
(Continued)

FOREIGN PATENT DOCUMENTS

JP    2004-214338    7/2004
JP    2006-210831    8/2006
(Continued)

OTHER PUBLICATIONS

Extended European Search Report for corresponding EP Application No. 15163161.1-1551, dated Aug. 19, 2015.
(Continued)

*Primary Examiner* — Phat X Cao
(74) *Attorney, Agent, or Firm* — Mori & Ward, LLP

(57) ABSTRACT

A semiconductor device in which wet-spreading of an adhesive member for bonding the semiconductor element on a base body is suppressed. The semiconductor device includes a base body, and a semiconductor element bonded on the base body via an adhesive member. The adhesive member contains surface-treated particles, or particles that coexist with a dispersing agent. At least a part of the marginal portion of the adhesive member is a region where the particles are unevenly distributed.

22 Claims, 10 Drawing Sheets

(51) Int. Cl.
*H01L 33/50* (2010.01)
*H01L 33/52* (2010.01)
*H01L 23/00* (2006.01)

(52) U.S. Cl.
CPC ........... *H01L 2224/29298* (2013.01); *H01L 2224/32245* (2013.01); *H01L 2224/45144* (2013.01); *H01L 2224/48091* (2013.01); *H01L 2224/48247* (2013.01); *H01L 2224/48257* (2013.01); *H01L 2224/48463* (2013.01); *H01L 2224/73265* (2013.01); *H01L 2924/00014* (2013.01); *H01L 2924/181* (2013.01); *H01L 2933/0091* (2013.01)

(56) References Cited

U.S. PATENT DOCUMENTS

| | | | |
|---|---|---|---|
| 2009/0039762 A1* | 2/2009 | Park | H01L 33/504 |
| | | | 313/502 |
| 2010/0186999 A1 | 7/2010 | Kuramoto et al. | |
| 2011/0291143 A1* | 12/2011 | Kim | H01L 33/56 |
| | | | 257/98 |
| 2012/0083056 A1* | 4/2012 | Shinbori | H01L 33/54 |
| | | | 438/27 |
| 2013/0277707 A1 | 10/2013 | Miyata | |
| 2014/0217433 A1* | 8/2014 | Tudorica | H01L 33/56 |
| | | | 257/89 |

FOREIGN PATENT DOCUMENTS

| | | |
|---|---|---|
| JP | 2007-036030 | 2/2007 |
| JP | 2008-120850 | 5/2008 |
| JP | 2010-283244 | 12/2010 |
| JP | 2012-77171 | 4/2012 |
| JP | 2012-222202 | 11/2012 |
| JP | 2013-65642 | 4/2013 |
| JP | 2013-243344 | 12/2013 |
| WO | WO 2009/090915 | 7/2009 |
| WO | WO 2010/077082 | 7/2010 |

OTHER PUBLICATIONS

Weon et al., "Self-Pinning by Colloids Confined at a Contact Line", Phys. Rev. Lett. 110, Jan. 11, 2013, pp. 028303-1-028303-5.

* cited by examiner

SEMICONDUCTOR DEVICE HAVING SEMICONDUCTOR ELEMENT BONDED TO BASE BODY BY ADHESIVE MEMBER

CROSS-REFERENCE TO RELATED APPLICATIONS

The present application claims priority under 35 U.S.C. § 119 to Japanese Patent Application No. 2014-082735, filed on Apr. 14, 2014, and Japanese Patent Application No. 2015-065053, filed on Mar. 26, 2015. The contents of these applications are incorporated herein by reference in their entirety.

BACKGROUND OF THE INVENTION

Field of the Invention

The disclosure relates to a semiconductor device.

Description of the Related Art

There has hitherto existed a photosemiconductor device in which a light emitting diode element is bonded on an upper surface of a substrate using a die bonding adhesive material (see, for example, JP 2012-077171 A).

However, such photosemiconductor device had a problem that the upper surface of the substrate may be contaminated by wet-spreading (including a phenomenon generally called "bleeding out") of the die bonding adhesive material, thus interfering with wire bonding and/or die bonding.

For example, JP 2004-214338 A mentions that such problem can be solved by formation of a groove on a surface of a lead electrode, but there is still room for improvement.

SUMMARY OF THE INVENTION

An embodiment of the present invention has been made in view of the foregoing circumstances, and it is an object of the embodiment of the present invention to provide a semiconductor device in which wet-spreading of an adhesive member for bonding the semiconductor element on a base body is suppressed.

In order to solve the foregoing problems, a semiconductor device according to one embodiment of the present invention includes a base body, and a semiconductor element bonded on the base body via an adhesive member, wherein the adhesive member contains particles selected from a group of (i) surface-treated particles and (ii) particles that coexist with a dispersing agent, and at least a part of the marginal portion of the adhesive member is a region where the particles are unevenly distributed.

According to one embodiment of the present invention, wet-spreading of the adhesive member can be suppressed.

DETAILED DESCRIPTION OF THE EMBODIMENT

Embodiments of the present invention will be appropriately described below with reference to the accompanying drawings. It should be noted, however, that a semiconductor device described below is intended to embody a technical idea of the present invention, and the present invention is not limited to those described below unless otherwise stated. Contents that will be described in one embodiment and Example can also be applied to another embodiments and Examples. In the respective accompanying drawings, size and positional relationships are sometimes exaggerated in order to make it easier to understand their description.

Hereinafter, a visible wavelength region falls within a range of 380 nm or more and 780 nm or less, a blue region falls within a range of 420 nm or more and 480 nm or less, a green region falls within a range of 500 nm or more and 560 nm or less, an yellow region falls within a range of more than 560 nm and 590 nm or less, a red region falls within a range of 610 nm or more and 750 nm or less, and an ultraviolet region falls within a range of 200 nm or more and less than 380 nm, respectively.

<First Embodiment>

Figure 1A:
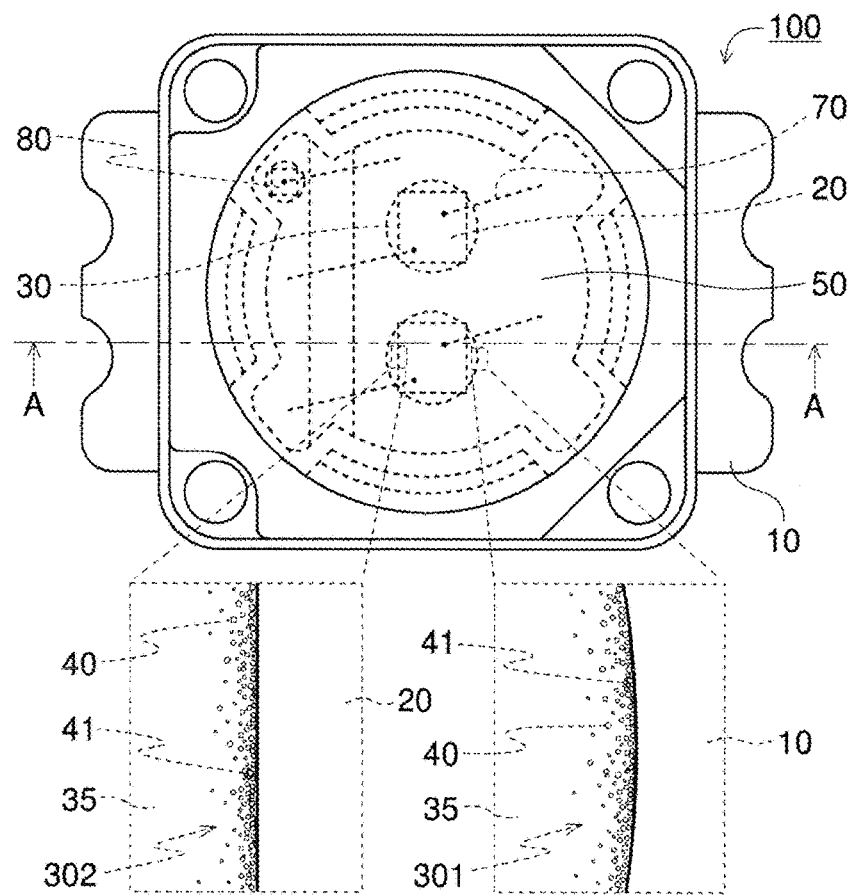
FIG. 1A is a schematic top view of a semiconductor device according to one embodiment of the present invention.
Figure 1B:
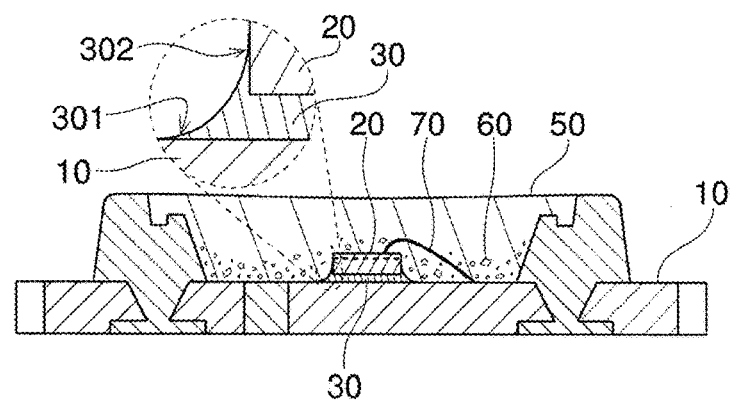
FIG. 1B is a schematic cross-sectional view taken along the line A-A of FIG. 1A.

FIG. 1A is a schematic top view of a semiconductor device according to a first embodiment, and FIG. 1B is a schematic cross-sectional view taken along the line A-A in FIG. 1A.

As show in FIG. 1A and 1B, a semiconductor device according to a first embodiment 100 includes a base body 10, a semiconductor element 20, and an adhesive member 30. The semiconductor element 20 is bonded on the base body 10 via the adhesive member 30. The semiconductor device 100 also includes a sealing member 50 for sealing the semiconductor element 20. Further, the semiconductor device 100 includes a protection element 80.

More specifically, the semiconductor device 100 is a surface mount LED. The semiconductor device 100 includes a base body 10 with a recessed portion formed at an upper surface, a semiconductor element 20 accommodated in the recessed portion of the base body 10, and a sealing member 50 filled in the recessed portion of the base body 10 so as to cover the semiconductor element 20. The base body 10 is a package that includes a pair of positive and negative lead electrodes, and a resin molded body, made of a white resin, for holding the lead electrodes. A part of the bottom surface of the recessed portion in the base body 10 is constituted by the upper surfaces of the lead electrodes. The semiconductor element 20 is an LED element and bonded to the bottom surface of the recessed portion of the base body 10 via an adhesive member 30, and connected to the lead electrodes via a wire 70. The sealing member 50 may include a resin as a base material, and contain a phosphor 50 in the base material.

The adhesive member 30 contains surface-treated particles 40. At least a part of the marginal portion 301 of the adhesive member is a region where at least either of particles 40 or an aggregate 41 thereof are/is unevenly distributed. Since the aggregate 41 is constituted by particles 40, it can be said that at least a part of the marginal portion 301 of the adhesive member is a region where particles 40 are unevenly distributed.

In the semiconductor device 100 having such structure, wet-spreading of the adhesive member 30 on an upper surface of the base body 10 is suppressed, thus enabling suppression of contamination of the placing portion of the semiconductor element 20 on the base body 10 and/or the connection portion of the wire 70 with the adhesive member 30. Therefore, the base body 10 can be connected to the semiconductor element 20 without hindrance, leading to sufficient connection strength between the base body 10 and the semiconductor element 20. Because of ease of increasing an application amount of the adhesive member 30, and/or ease of forming sufficient fillet, and/or capability of suppressing the occurrence of solidification failure of the adhesive member 30 with comparatively large volatility, high connection strength between the base body 10 and the semiconductor element 20 maybe obtained. In addition, there may be no need to coat the upper surface of the base body 10 with a bleed-out inhibitor having small surface energy, and no need to design the composition of the adhesive member 30 so that wet-spreading scarcely occurs or low volatility is achieved. Thus, the occurrence of electrical open defects and deterioration of heat radiation properties as well as disconnection of the wire 70 due to peeling of the adhesive member 30 are suppressed. Consequently, a semiconductor device that has high reliability can be obtained. Further, the semiconductor element 20 may be mounted easily on the base body 10 in high density.

A region of the adhesive member 30 of at least either of particles 40 or an aggregate 41 thereof are/is unevenly distributed may be a part of the marginal portion 301 of the adhesive member, but is preferably half or more of the marginal portion 301 of the adhesive member, and more preferably almost the whole of the marginal portion 301 of the adhesive member.

In the present embodiment, the same actions and effects may be obtained even if surface-treated particles 40 are replaced by particles that coexist with a dispersing agent. The particles that coexist with a dispersing agent may be obtained by mixing the adhesive member with particles and a dispersing agent for dispersing the particles and, for example, the obtained particles are particles to which the dispersing agent is adsorbed.

The phrase "unevenly distributed" as used herein means that particles and the like exist in high density in a specific region. The particles and the like may exist in low density in a region except for the specific region.

On the upper surface of the base body 10, the principle of suppression of wet-spreading of the adhesive member 30 by at least either of particles 40 or an aggregate 41 thereof can be described as follows.

Figure 2A:
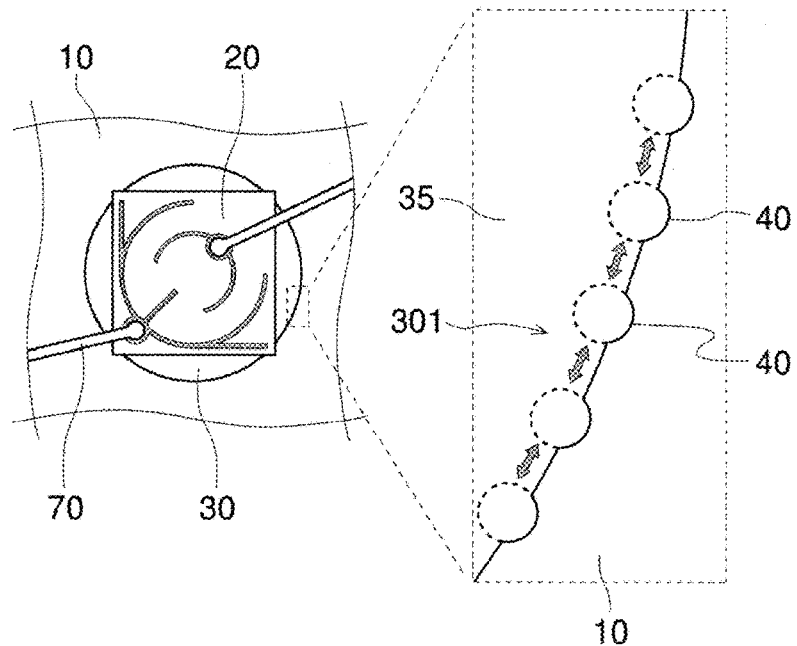
FIGS. 2A and 2B are schematic views for explaining the principle of suppression of wet-spreading of an adhesive member on an upper surface of a base body in the embodiment of the present invention.
Figure 2B:
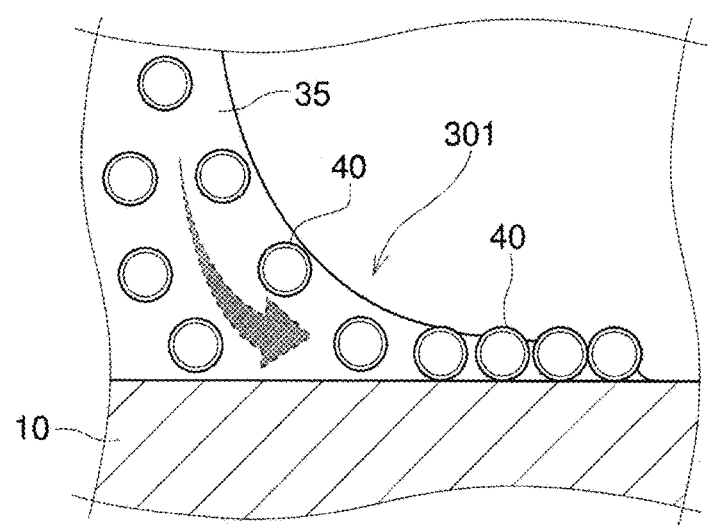

FIGS. 2A and 2B are schematic views for explaining the principle of suppression of wet-spreading of an adhesive member on an upper surface of a base body in the present invention. It is considered that the principle of suppression of wet-spreading of the adhesive member 30 on the upper surface of the base body 10 includes two stages. A first stage will be described with reference to FIG. 2A. The first stage proceeds from dispersion of particles 40 with less interaction between particles in the base material 35 of a liquid adhesive member, namely, dispersion of particles 40 with suppressed aggregation property, and preferably approximately uniform dispersion. Before solidification, when the adhesive member 30 is applied on the upper surface of the base body 10, a meniscus end is formed at the marginal portion 301 thereof. A capillary force is generated between particles 40 that exist at tip (in the vicinity of a contact point among three phases of air (gas), a base material of an adhesive member (liquid), and a base body (solid)) of the adjacent meniscus ends. The capillary force operates so as to pull particles 40 existing at tip of the adjacent meniscus end together. The capillary force continuously operates along the marginal portion 301 of the adhesive member, thus suppressing wet-spreading of the adhesive member 30 applied on the upper surface of the base body 10 before solidification. In particular, the capillary force operates along almost the whole of the marginal portion 301 of the adhesive member, thus making it possible to effectively suppress wet-spreading the adhesive member 30 before solidification. Since the capillary force is likely to be exerted in a colloidal solution with high dispersibility of particles (see, for example, aforementioned B M. Weon, J H. Je, Self -Pinning by Colloids Confined at a Contact Line, Phys. Rev. Lett. 110, 028303 (2013)), it is possible to efficiently exert by subjecting particles 40 to a surface treatment for suppressing aggregation of particles or mixing a dispersing agent together with particles 40.

A second stage will be described with reference to FIG. 2B. The second stage proceeds from heating that urges solidification of the adhesive member 30. In the process for solidification of the adhesive member 30, the marginal portion 301 has a very thin meniscus end and a low boiling point component (for example, a low boiling point siloxane in the case of a silicone resin) in the base material 35 of the adhesive member vaporizes most quickly. A change in surface tension of the meniscus end of the marginal portion 301 caused by the vaporization leads to generation of a surface tension flow that flows toward the meniscus end in the adhesive member 30 before solidification. The adhesive member 30 transferred to the meniscus end of the marginal portion 301 before solidification is returned to the inside since wet-spreading is suppressed by the capillary force, leading to generation of a convection current at the meniscus end of the marginal portion 301. In this process, at the meniscus end of the marginal portion 301, particles 40 transferred by the convection current are aligned by the capillary force and/or aggregated due to a local increase in concentration of particles. Particles 40 thus gathered at the marginal portion 301 of the adhesive member further suppress wet-spreading of the adhesive member 30 with decreased viscosity and surface tension undergo volume expansion when heated. It is also possible to describe the second stage by the principle of the generation of so-called "ring stain".

At least a part of the marginal portion 301 of the adhesive member thus solidified becomes a region where at least either of particles 40 or an aggregate 41 thereof are/is unevenly distributed. Since the capillary force depends on dispersibility of particles, the number of particles 40 is preferably more than that of an aggregate 41 from the viewpoint of suppressing wet-spreading of the adhesive member 30, but the capillary force also acts to the aggregate 41 of particles. In the process for solidification of the adhesive member 30, particles 40 may aggregate, leading to observation of numerous aggregates 41 of particles in the solidificated adhesive member 30.

Preferred mode of the semiconductor device 100 will be described below.

An adhesive member 30 includes a creep-up portion 302 provided by creeping-up a side surface of a semiconductor element 20. At least a part of the creep-up portion 302 of an adhesive member is a region where at least either of particles 40 or an aggregate 41 of the particles are/is unevenly distributed. Since the aggregate 41 is constituted by particles 40, it can be said that at least a part of the creep-up portion 302 of the adhesive member is a region where particles 40 are unevenly distributed. Accordingly, wet-spreading of the adhesive member 30 toward an upper portion of the semiconductor element 20 is suppressed, thus enabling suppression of contamination of the electrode of the semiconductor element 20 and/or a laminate of a semiconductor layer with the adhesive member 30. Therefore, a wire 70 can be connected to the semiconductor element 20 without hindrance, and also short circuit of the laminate of the semiconductor layer due to the adhesive member 30 can be suppressed. Because of ease of increasing an application amount of the adhesive member 30, and/or ease of forming sufficient fillet, and/or capability of suppressing the occurrence of solidification failure of the adhesive member 30 with comparatively large volatility, it is easy to obtain high connection strength between the base body 10 and the semiconductor element 20. Thus, it is made possible to obtain a semiconductor device that can suppress the occurrence of disconnection of the wire 70 and/or failure of a semiconductor element structure, and has high reliability.

A region of the adhesive member 30 that at least either of particles 40 or an aggregate 41 thereof are/is unevenly distributed may be a part of the creep-up portion 302 of the adhesive member, but is preferably half or more of the creep-up portion 302 of the adhesive member, and more preferably almost the whole of the creep-up portion 302 of the adhesive member.

On the side surface of the semiconductor element 20, the principle of suppression of wet-spreading of the adhesive member 30 by at least either of particles 40 or an aggregate 41 thereof can be described as follows.

Figure 3A:
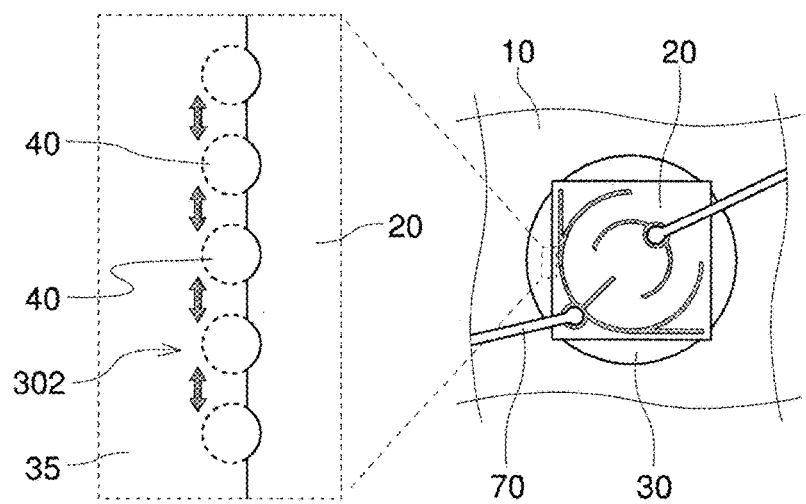
FIG. 3A and 3B are schematic views for explaining the principle of suppression of wet-spreading of an adhesive member on a side surface of a semiconductor element in the embodiment of the present invention.
Figure 3B:
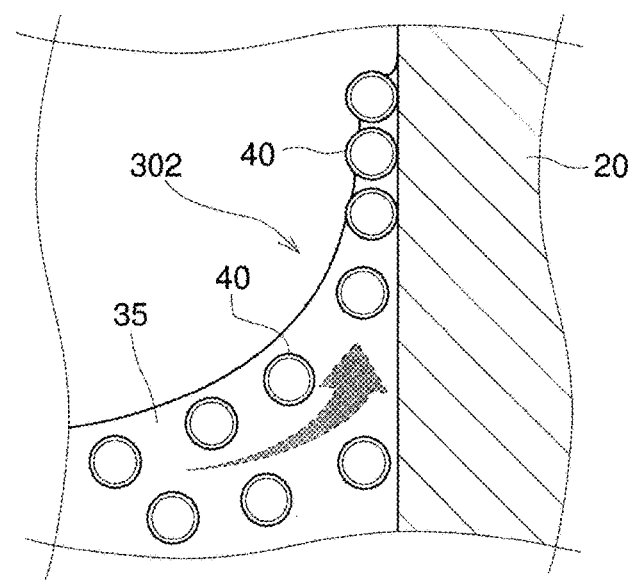

FIGS. 3A and 3B are schematic views for explaining the principle of suppression of wet-spreading of an adhesive member on a side surface of a semiconductor element in the present invention. It is considered that the principle of suppression of wet-spreading of the adhesive member 30 on the side surface of the semiconductor element 20 includes two stages. A first stage will be described with reference to FIG. 3A. The first stage proceeds from dispersion of particles 40 with less interaction between particles in the base material 35 of a liquid adhesive member, namely, dispersion of particles 40 with suppressed aggregation property, and preferably approximately uniform dispersion. Before solidification, when the adhesive member 30 creeps up the side surface of the semiconductor element 20, a meniscus end is formed at the creep-up portion 302 thereof. A capillary force is generated between particles 40 that exist at tip (in the vicinity of a contact point among three phases of air (gas), a base material of an adhesive member (liquid), and a base body (solid)) of the adjacent meniscus ends. The capillary force operates so as to pull particles 40 existing at tip of the adjacent meniscus end together. The capillary force continuously operates along the creep-up portion 302 of the adhesive member, thus suppressing wet-spreading of the adhesive member 30 crept up the side surface of the semiconductor element 20 before solidification. In particular, the capillary force operates along almost the whole of the creep-up portion 302 of the adhesive member, thus making it possible to effectively suppress wet-spreading the adhesive member 30 before solidification. Since the capillary force is likely to be exerted in a colloidal solution with high dispersibility of particles (see, for example, aforementioned B M. Weon, J H. Je, Self-Pinning by Colloids Confined at a Contact Line, Phys. Rev. Lett. 110, 028303 (2013)), it is possible to efficiently exert by subjecting particles 40 to a surface treatment for suppressing aggregation of particles or mixing a dispersing agent together with particles 40.

A second stage will be described with reference to FIG. 3B. The second stage proceeds from heating that urges solidification of the adhesive member 30. In the process for solidification of the adhesive member 30, the creep-up portion 302 has a very thin meniscus end and a low boiling point component (for example, a low boiling point siloxane in the case of a silicone resin) in the base material 35 of the adhesive member vaporizes most quickly. A change in surface tension of the meniscus end of the creep-up portion 302 caused by the vaporization leads to generation of a surface tension flow that flows toward the meniscus end in the adhesive member 30 before solidification. The adhesive member 30 transferred to the meniscus end of the creep-up portion 302 before solidification is returned to the inside since wet-spreading is suppressed by the capillary force, leading to generation of a convection current at the meniscus end of the creep-up portion 302. In this process, at the meniscus end of the creep-up portion 302, particles 40 transferred by the convection current are aligned by the capillary force and/or aggregated due to a local increase in concentration of particles. Particles 40 thus gathered at the creep-up portion 302 of the adhesive member further suppress wet-spreading of the adhesive member 30 with decreased viscosity and surface tension undergo volume expansion when heated. It is also possible to describe the second stage by the principle of the generation of so-called "ring stain".

At least a part of the creep-up portion 302 of the adhesive member thus solidified becomes a region where at least either of particles 40 or an aggregate 41 thereof are/is unevenly distributed. Since the capillary force depends on dispersibility of particles, the number of particles 40 is preferably more than that of an aggregate 41 from the viewpoint of suppressing wet-spreading of the adhesive member 30, and the capillary force also acts to the aggregate 41 of particles. In the process for solidification of the adhesive member 30, particles 40 may aggregate, leading to observation of numerous aggregates 41 of particles in the solidificated adhesive member 30.

(Particles 40)

Particles 40 are mixed in a base material 35 of the adhesive member and have the action of suppressing wet-spreading of the adhesive member 30. The particles 40 will be mentioned in detail below. When notational distinction is made between particles 40 and the below-mentioned fillers and phosphors, particles 40 are referred to as first particles, while other fillers and phosphors are referred to as second particles, third particles, and the like.

It is possible to use, as particles 40, particles having a particle diameter of, for example, 1 nm or more and 100 μm or less. However, particles are preferably nanoparticles (that can be defined as particles having a particle diameter of 1 nm or more and 100 nm or less). If particles 40 are nanoparticles, the above capillary force can be obtained by mixing in a small amount, thus enabling suppression of wet-spreading of the adhesive member 30. Among them, particles 40 are more preferably particles having a particle diameter of 5 nm or more and 50 nm or less. An aggregate 41 of particles is obtained as a result of aggregation of particles 40. The aggregate 41 of particles is easily observed because of its size larger than that of particles 40, and the presence of particles 40 can be estimated by observation of the presence. The diameter of the aggregate 41 of particles is, for example, about 100 nm to 300 μm, and preferably 100 nm or more and 100 μm or less. Particles 40 or the aggregate 41 thereof may have the action of scattering light of the semiconductor element 20. In particular, when particles 40 are nanoparticles, scattering of short-wavelength light such as blue light can be increased by Rayleigh scattering. Generation of Rayleigh scattering facilitates excitation of a phosphor 60 and thus cost of the semiconductor device can be reduced by decreasing the amount of the phosphor 60 to be mixed. It is also possible to enhance light extraction efficiency as a result of an improvement in light transmittance of the adhesive member 30. The particle diameter of particle 40 can be defined by an average particle diameter (e.g. $D_{50}$). The diameter of particles or an aggregate 41 thereof can be measured by a laser diffraction-scattering method, an image analysis method (scanning electron microscope (SEM), transmission electron microscope (TEM)), a dynamic light scattering method, an X-ray small angle scattering method, or the like, and preferably an image analysis method among them. The image analysis method is in conformance with, for example, JIS Z 8827-1:2008.

The shape of particles 40 is not particularly limited and may be an irregular crushed shape, but preferably a spherical shape since aggregation can be suppressed by minimize contact between particles. Particles 40 having a plate-like shape can impart gas barrier properties to the adhesive member 30.

Particles 40 are not particularly limited and may be made of either an organic substance or an inorganic substance. Particles 40 may be constituted by a substance alone, or may be constituted by a combination of two or more of substances. Particles 40 are preferably made of a translucent substance from the viewpoint of light extraction efficiency of the semiconductor device. Particles 40 preferably have a melting point of 260° C. or higher from the viewpoint of solder heat resistance. Particles 40 may further have electrical conductivity, but preferably electrical insulating properties from the viewpoint of avoiding short circuit of the semiconductor element 20. Specifically, the organic substance is preferably a resin such as a polymethacrylic acid ester and a copolymer thereof, a polyacrylic acid ester and a copolymer thereof, a cross-linked polymethacrylic acid ester, a cross-linked polyacrylic acid ester, polystyrene and a copolymer thereof, a cross-linked polystyrene, an epoxy resin, a silicone resin, or an amorphous fluororesin. The particles 40 may be Core-shell type particles obtained by coating inorganic particles with at least one resin selected therefrom. Since particles of such organic substance are capable of corresponding a refractive index to that of a base material 35 of an adhesive member by copolymerization, less optical influence is exerted, for example, translucency can be maintained even when aggregated. Meanwhile, the inorganic substance is preferably an oxide such as silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, or tin oxide. Particles of such inorganic substance are good in heat resistance and light resistance, and also exhibit comparatively high thermal conductivity. Among them, silicon oxide, aluminum oxide, zirconium oxide, and titanium oxide are easily available and relatively inexpensive. It is also possible to use particles 40 that are the same as the below-mentioned phosphor 60.

Particles 40 may also quantum dots. Quantum dots are particles having a particle diameter of 1 nm or more and 100 nm or less of a compound semiconductor, and are also referred to as a nanophosphor. It is possible for quantum dots to select an emission wavelength by changing the size (particle diameter). The quantum dot is, for example, a compound of Group 12 element and Group 16 element, a compound of Group 13 element and Group 16 element, or a compound of Group 14 element and Group 16 element. Specific examples thereof include cadmium selenide, cadmium telluride, zinc sulfide, cadmium sulfide, lead sulfide, or lead selenide. When particles 40 are phosphors (including quantum dots) and the semiconductor element 20 is a light emitting element capable of emitting ultraviolet or blue light, particles 40 are preferably capable of emitting red light. Accordingly, absorption of light emitted by particles 40 due to the phosphor 60 (phosphor 60 are capable of emitting, for example, green or yellow light) in the sealing member 50 is suppressed, thus obtaining a semiconductor device (light emitting device) having satisfactory luminous efficiency.

Particles 40 are preferably subjected to a surface treatment (i.e. formation of an attached substance onto a surface of particles 40) Accordingly, aggregation of particles 40 is suppressed, namely, dispersibility of particles 40 is enhanced, and thus it is easy to exert a capillary force and to suppress wet-spreading of the adhesive member 30. Examples of such surface treatment material of particles 40 include a long-chain aliphatic amine and derivatives thereof, a long-chain aliphatic fatty acid and derivatives thereof, a silane coupling agent, a siloxane compound having an amine group and/or a carboxyl group, a siloxane compound having at least one selected from a silanol group, a hydrogensilane group, and an alcohol group, a siloxane compound having at least one selected from a silanol group, an alkoxy group, and a hydrogensilane group, and a vinylsilyl group, a monoglycidyl ether-terminated siloxane compound, a monohydroxyether-terminated siloxane compound, an organic silazane compound, an organic titanate compound, an isocyanate compound, an epoxy compound, phosphoric acid, and a phosphoric acid ester compound, and the like. Examples of the dispersing agent include, in addition to the above surface treatment material, a polymer compound having an acidic group or a basic group, a fluorine-containing surfactant, a polyol compound, polyethylene oxide derivatives, polypropylene oxide derivatives, polyhydric fatty acid derivatives, hydrolyzates of a silane coupling agent, a quaternary ammonium salt compound, and the like. When particles 40 are nanoparticles, a surface treatment is preferably applied. When particles 40 are micron particles, mixing of a dispersing agent is also preferable.

Figure 4A:
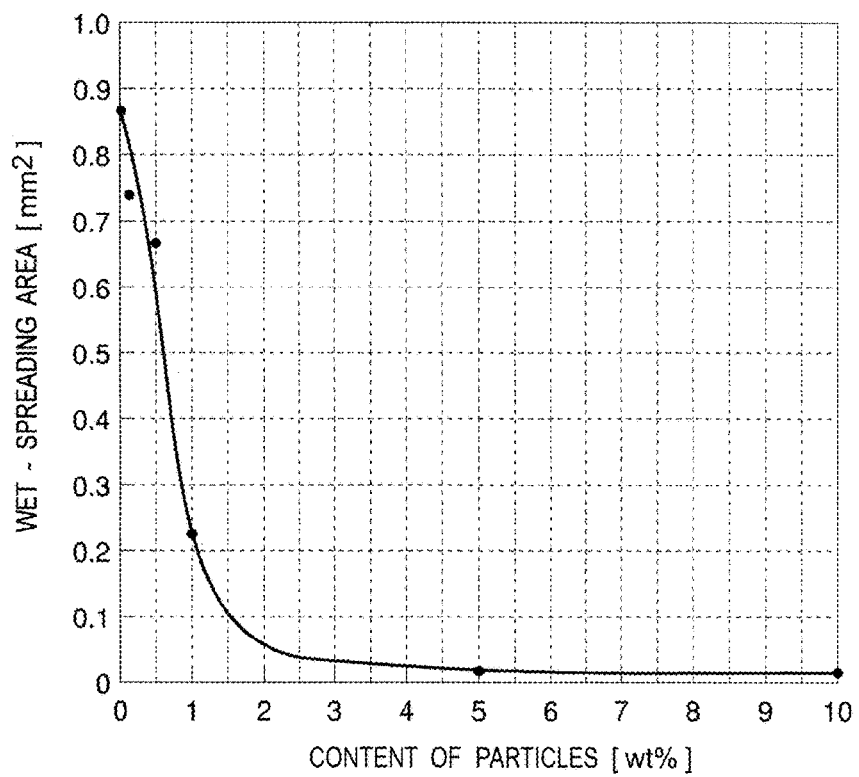
FIG. 4A is a graph showing a relationship between the content of surface-treated particles and the wet-spreading area in an adhesive member of a semiconductor device according to one embodiment of the present invention.
Figure 4B:
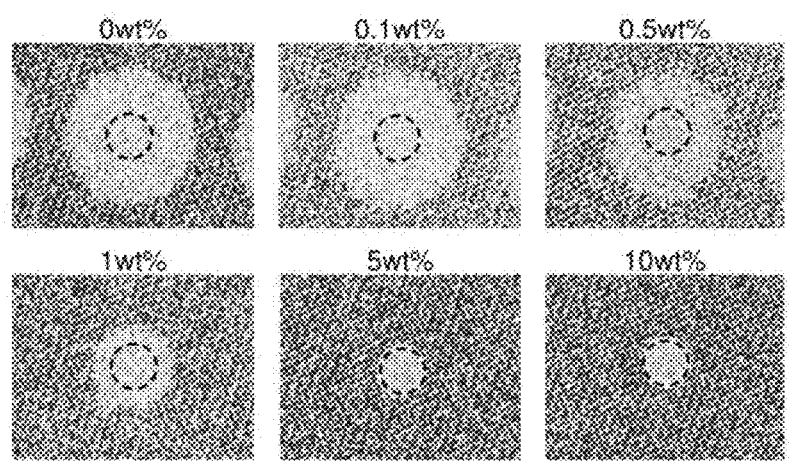
FIG. 4B shows images of an upper surface observed by an optical microscope, each illustrating a part of the relationship by Test Example.

FIGS. 4A and 4B are respectively as follows: FIG. 4A is a graph showing a relationship between the content of surface-treated particles and the wet-spreading area in an adhesive member of a semiconductor device 100 according to a first embodiment of the present invention, and FIG. 4B shows images of an upper surface observed by an optical microscope, each illustrating a part of the relationship by Test Example. A wet-spreading area of the adhesive member in FIGS. 4A and 4B is obtained as follows: the adhesive member is applied on an upper surface of a lead electrode with silver plating and, after being left to stand at normal temperature for 2 hours, the area immediately after application is subtracted from the area in a solidified state. The area (indicated by a dotted-line circle in FIG. 4B) immediately after application of the adhesive member is about 0.12 mm$^2$. The adhesive member 30 exhibits a relationship of this graph can be, for example, the same as that of the below-mentioned Example 1, but is not limited thereto. As shown in FIGS. 4A and 4B, if the content (s) of particles 40 and/or the aggregate 41 thereof is/are 0.1% by weight or more, it is easy to obtain the action of suppressing wet-spreading of the adhesive member 30. The upper limit of the contents (s) of particles 40 and/or the aggregate 41 thereof is not particularly limited from the viewpoint of obtaining the action of suppressing wet-spreading of the adhesive member 30. The content (s) of particles 40 and/or the aggregate 41 thereof of more than 50% by weight may lead to an increase in excessive viscosity of the adhesive member 30, white turbidity, excessive aggregation of particles 40, and the like. Therefore, the content (s) of particles 40 and/or an aggregate 41 thereof is/are preferably 0.1% by weight or more and 50% by weight or less. In particular, if the content (s) of particles 40 and/or an aggregate 41 thereof is/are 1% by weight or more and 20% by weight or less, it is possible to obtain the action of suppressing wet-spreading of the adhesive member 30 in a stable manner while satisfactorily maintaining various properties of the adhesive member 30. The content (s) of particles 40 and/or an aggregate 41 thereof is/are more preferably 5% by weight or more and 20% by weight or less. The content (s) of particles 40 and/or an aggregate 41 thereof correspond (s) to the amount of particles 40 to be mixed, and is/are expressed by % by weight as a ratio of the adhesive member to the base material 35. In this way, it is a big advantage in the production of a semiconductor device to suppress wet-spreading of adhesive member 30 by a very small amount of particles 40 to be mixed.

Figure 5A:
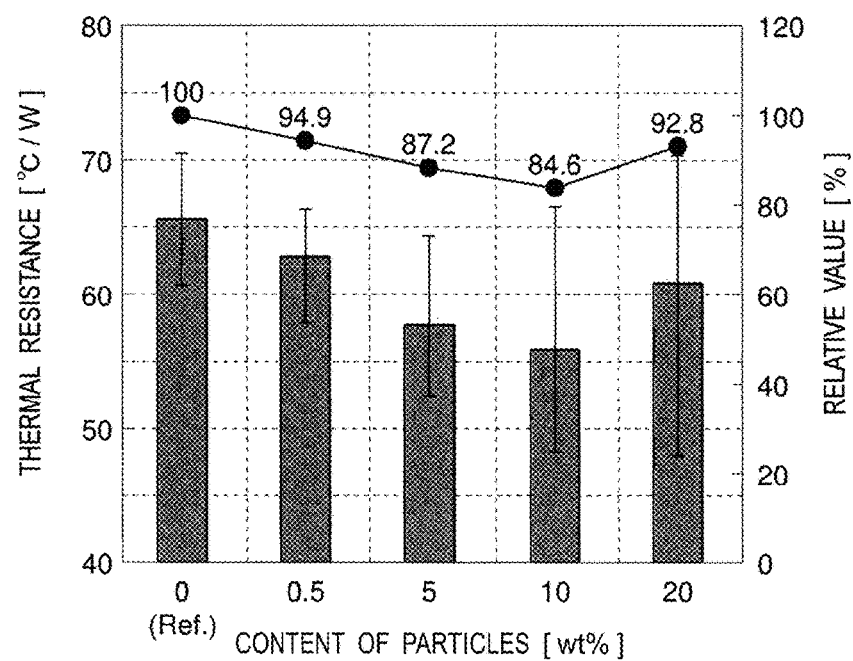
FIG. 5A is a graph showing a relationship between the content of surface-treated particles and the thermal resistance in an adhesive member of a semiconductor device according to one embodiment of the present invention.
Figure 5B:
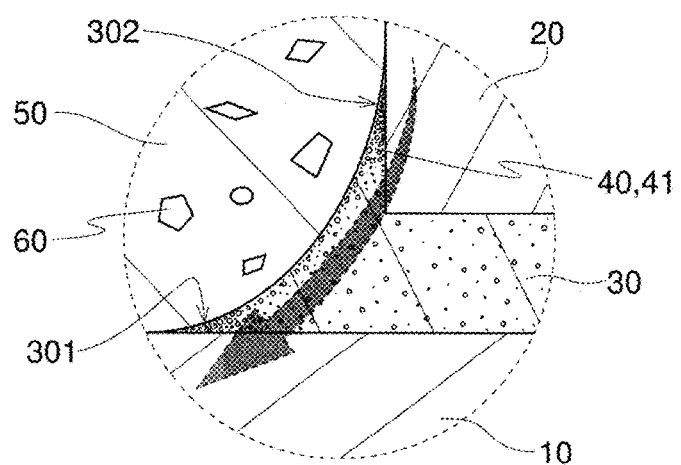
FIG. 5B is a schematic view for explaining deterioration of thermal resistance.

FIGS. 5A and 5B are respectively as follows: FIG. 5A is a graph showing a relationship between the content of surface-treated particles and the thermal resistance in an adhesive member of a semiconductor device according to a first embodiment of the present invention, and FIG. 5B is a schematic view for explaining deterioration of thermal resistance. The adhesive member 30 exhibits a relationship of this graph can be, for example, the same as that of the below-mentioned Example 1, but is not limited thereto. As shown in FIG. 5A, the adhesive member 30 mixed with particles 40 exhibits low thermal resistance as compared with an adhesive member (Ref.) mixed with no particles 40. This reason can be estimated as follows. As shown in FIG. 5B, thermal conductivity of a surface layer region (including an intermediate surface layer portion between the creep-up portion 302 and the marginal portion 301) that connects the creep-up portion 302 of the solidified adhesive member with the marginal portion 301 is enhanced by particles 40 and/or the aggregate 41 thereof that exist(s) in the surface layer region, and it becomes easy for heat to transfer from the semiconductor element 20 to the base body 10 through this surface layer region as a passage (see arrow in FIG. 5E). Particularly, regarding the adhesive member 30 having translucency, using, as particles 40, nanoparticles having low light shielding property, especially nanoparticles having a particle diameter of 5 nm or more and 50 nm or less, when nanoparticles are unevenly distributed to the surface layer region of the adhesive member 30 in a self-organization manner by a convection current and a capillary force, it is possible to simultaneously realize securement of good translucency of the adhesive member 30 and deterioration of thermal resistance. Particles 40 having a particle diameter of less than 5 nm facilitates generation of aggregation and deterioration of translucency. Meanwhile, particles 40 having a particle diameter of more than 50 nm cause deterioration of translucency due to slight aggregation. Therefore, the above nanoparticles are preferably used as particles 40. From the viewpoint of a reduction in thermal resistance, particles 40 are preferably made of a material having good thermal conductivity. Examples of the material having good thermal conductivity include aluminum oxide, aluminum nitride, boron nitride, silicon nitride, and the like. Among them, aluminum oxide is preferable from comprehensive viewpoints such as thermal conductivity, translucency, and cost. From the viewpoint of thermal conductivity, aluminum nitride is also preferable. As particles 40 have smaller particle diameter, particles easily incorporate into molecular chains of the base material 35 (e.g. resin) of the adhesive member, leading to strong restriction of the base material of the adhesive member 35, and thus an improvement in thermal conductivity of the base material 35 itself can be expected.

Figure 6:
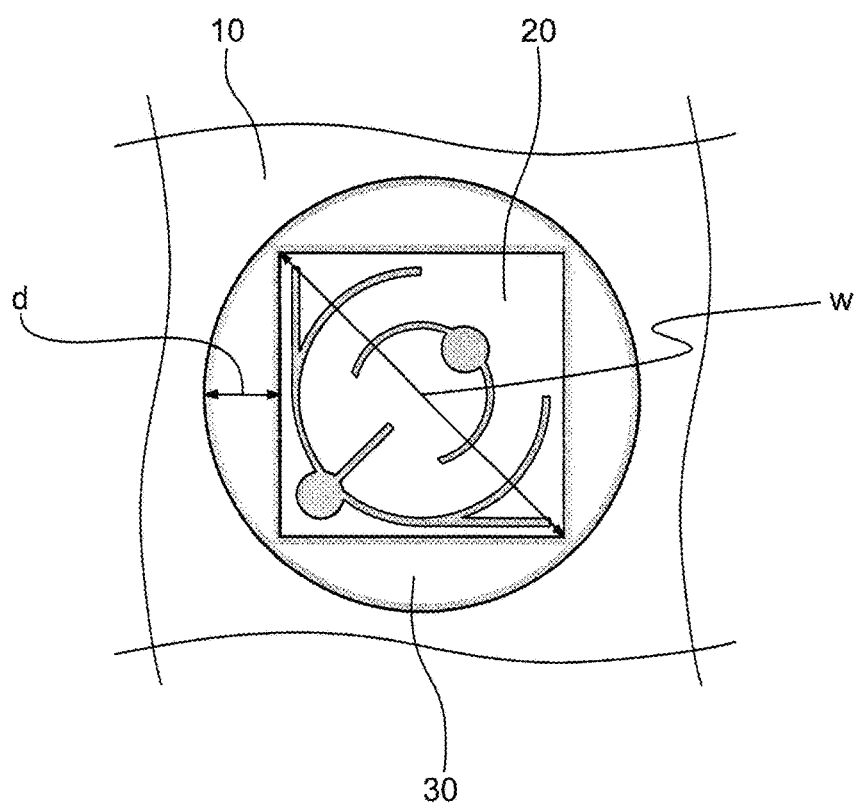
FIG. 6 is a schematic top view for explaining a relationship between a semiconductor element and an adhesive member in a semiconductor device according to one embodiment of the present invention.

FIG. 6 is a schematic top view for explaining a relationship between a semiconductor element and an adhesive member in a semiconductor device according to a first embodiment of the present invention. The longest distance (indicated by "d" in FIG. 6) between a side surface of a semiconductor element 20 and the marginal portion 301 of an adhesive member viewed from the top surface side is not particularly limited and preferably accounts for 50% or less of the longest size (indicated by "w" in FIG. 6) of the semiconductor element 20, more preferably 30% or less of the longest size w, and still more preferably, 20% or less of the longest size w. This is because, as a distance between the marginal portion 301 and the creep-up portion 302 of the adhesive member 30 decreases, particles 40 and/or an aggregate 41 (i.e. two ring spots due to particles 40) thereof gathered at each of the marginal portion 301 and the creep-up portion 302 approach each other, and thus thermal conductivity of the surface layer region is easily enhanced. The lower limit of the longest distance d is not particularly limited and accounts for, for example, about 1% of the longest size w. The "viewed from the top surface side" as used herein means a viewpoint of looking down perpendicularly to an upper surface of the base body 10 or an upper surface of the semiconductor element 20.

When the semiconductor element 20 is a light emitting device, the sealing member 50 preferably contain a phosphor 60 that is unevenly distributed at the semiconductor element 20 side in the sealing member 50. As mentioned above, since the adhesive member 30 of the present embodiment can cause deterioration of thermal resistance, it is possible to suppress deterioration of the phosphor 60 due to heat by disposing the phosphor 60 in the vicinity of the semiconductor element 20. It is particularly effective when the phosphor 60 contains fluoride phosphor having comparatively low heat resistance. Fluoride phosphor includes, for example, potassium fluorosilicate activated with manganese, or the like.

<Second Embodiment>

Figure 7A:
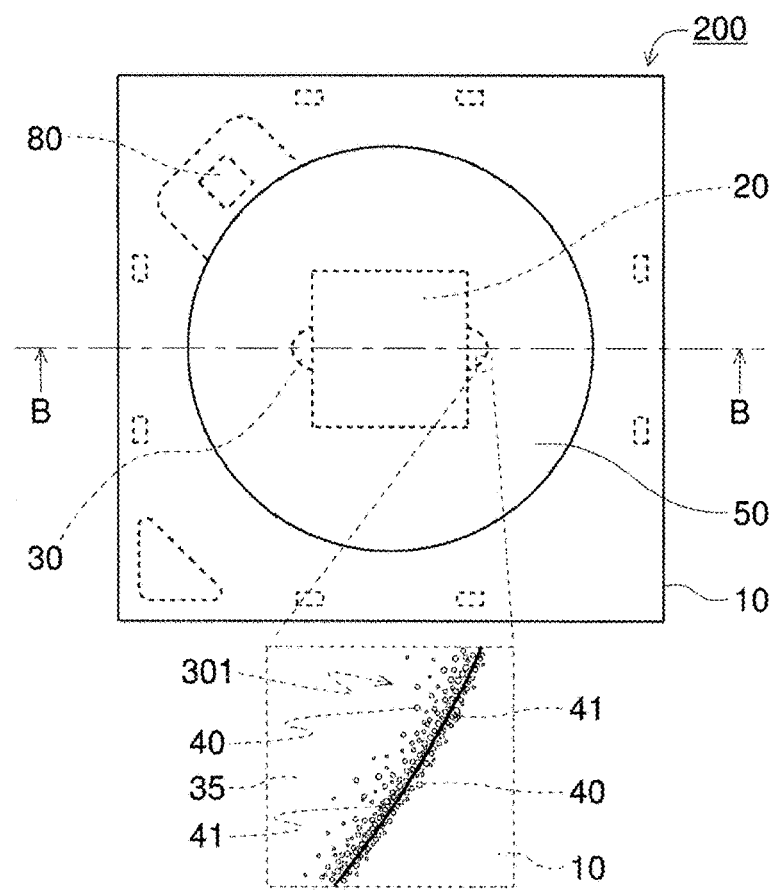
FIG. 7A is a schematic top view of a semiconductor device according to one embodiment of the present invention.
Figure 7B:
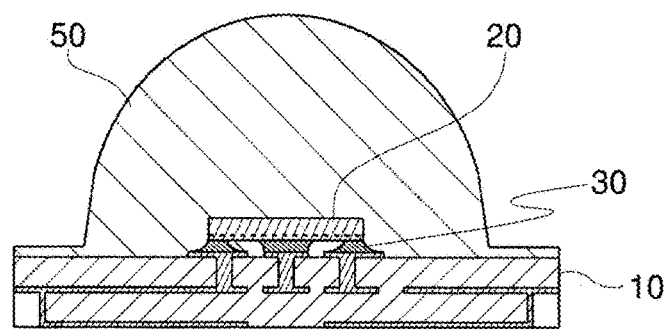
FIG. 7B is a schematic cross-sectional view taken along the line B-B of FIG. 7A.

FIG. 7A is a schematic top view of a semiconductor device according to a second embodiment of the present invention, and FIG. 7B is a schematic cross-sectional view taken along the line B-B in FIG. 7A.

As shown in FIG. 7, a semiconductor element 200 according to the second embodiment includes a base body 10, a semiconductor element 20, and an adhesive member 30. The semiconductor element 20 is bonded on the base body 10 via the adhesive member 30. The semiconductor element 200 also includes a sealing member 50. The semiconductor element 200 further includes a protection element 80.

More specifically, the semiconductor element 200 is a surface mount LED. The semiconductor element 200 includes abase body 10 having an approximately flat upper surface, a semiconductor element 20 disposed on an upper surface of the base body 10, and a sealing member provided to cover the semiconductor element 20 on an upper surface of the base body 10. The base body 10 is a wiring substrate that includes a pair of positive and negative wirings, and a base for holding the wirings. The semiconductor element 20 is a LED element and bonded to wirings of the base body 10 via a conductive adhesive member 30. A sealing member 50 may include a resin as a base material, and an upper surface thereof includes, for example, a hemispherical projecting surface region on the semiconductor element 20.

The adhesive member 30 contains surface-treated particles 40. At least a part of the marginal portion 301 of the adhesive member is a region where at least either of particles 40 or an aggregate 41 thereof are/is unevenly distributed.

Also in the semiconductor element 200 having such structure, wet-spreading of the adhesive member 30 is suppressed. Also in the present embodiment, the same actions and effects may be obtained even if surface-treated particles 40 are replaced by particles that coexist with a dispersing agent. The particles that coexist with a dispersing agent may be obtained by mixing an adhesive member with particles, and a dispersing agent for dispersing the particles and, for example, the obtained particles are particles to which the dispersing agent is adsorbed.

In the semiconductor element 200, at least either of particles 40 or the aggregate 41 also exist (s) at the outer periphery of the adhesive member 30, namely, in the vicinity of the outside of the marginal portion 301 of the adhesive member. The particles 40 and/or the aggregate 41 thereof existing at the outer periphery of the adhesive member 30 acts so as to damp up the adhesive member 30, thus making it possible to further suppress wet-spreading of the adhesive member 30.

The respective constituents of the semiconductor device according to one embodiment of the present invention will be described below.

(Semiconductor Device 100)

A semiconductor device includes at least a base body and a semiconductor element, semiconductor element being bonded on the base body. The semiconductor device may be either a surface mount type, or a lead insertion type.

(Base Body 10)

A base body is a member serving as a casing or a pedestal on which a semiconductor element is mounted. The base body can mainly take the form of a package including a lead frame and a molded body, or the form of a wiring board including a base and a wiring. More specifically, the base body includes a base body in which a resin molded body is integrally molded with a lead frame by transfer molding or injection molding, a base body in which a ceramic green sheet printed with a conductive paste are laminated and fired, or the like. Preferably, the surface, on which the semiconductor element of the base body is placed, is approximately flat, but may be curved. The base body for use can be a plate-like one, one that has a recessed portion (cup portion), and the like. The plate-like base body makes it easier to mount the semiconductor element thereon, while the base body with the recessed portion tends to easily improve the light extraction efficiency. The recessed portion may be formed by recessing a molded body or base itself, or by separately forming a frame-shaped protrusion on an upper surface of an approximately flat molded body or base, thus using the inside of the protrusion as the recessed portion. Examples of the shape viewed from the top surface side of the recessed portion include a rectangular shape, a rectangular shape with rounded corners, a circular shape, elliptical shape, and the like. In order to facilitate release of a molded body from a mold and to efficiently extract light of the semiconductor element, a side wall surface of the recessed portion preferably inclines so as to expand (including curve) upward from a bottom surface of the recessed portion (inclination angle is, for example, 95° or more and 120° or less from a bottom surface of the recessed portion). The depth of the recessed portion is not particularly limited and is, for example, 0.05 mm or more and 2 mm or less, preferably 0.1 mm or more and 1 mm or less, and more preferably 0.25 mm or more and 0.5 mm or less.

(Package)

It is possible to use, as the material of the lead electrode, metal that is electrically conductive by being connected to a semiconductor element. Specific examples thereof include copper, aluminum, gold, silver, tungsten, iron, nickel, cobalt, molybdenum, or alloys thereof, phosphor bronze, a copper-iron alloy, and the like. The lead electrode may be formed of a laminate of base metal, but is preferably formed of a single layer because of its simplicity. In particular, a copper alloy containing copper as a main component is preferable. A surface layer thereof may be provided with a plated or light reflecting filmmade of silver, aluminum, rhodium, gold, copper, or an alloy thereof. Among them, silver having good light reflectivity is preferable. The lead electrode is obtained, for example, by dicing a lead frame as an individual semiconductor device through cut forming. The lead frame is formed of, as a base, a metal sheet made of the above material subjected to various processing processes such as pressing, etching, and rolling processes. The thickness of the lead electrode can be optionally selected and, for example, 0.1 mm or more and 1 mm or less, and preferably 0.2 mm or more and 0.4 mm or less.

A molded body is integrally molded with a lead electrode to form a package. Examples of the base material of the molded body include thermoplastic resins such as an alicyclic polyamide resin, a semi-aromatic polyamide resin, polyethylene terephthalate, polycyclohexane terephthalate, a liquid crystal polymer, a polycarbonate resin, syndiotactic polystyrene, polyphenylene ether, polyphenylene sulfide, a polyethersulfone resin, a polyether ketone resin, and a polyallylate resin; or thermosetting resins such as a polybismaleimide triazine resin, an epoxy resin, an epoxy-modified resin, a silicone resin, a silicone-modified resin, a polyimide resin, and a polyurethane resin; or a modified or hybrid resin thereof. The molded body can also contain in these base materials, as a filler or a color pigment, particles or fibers of one selected of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chromium oxide, manganese oxide, carbon black, and the like.

(Wiring Substrate)

The base of a wiring substrate may be those having electrical insulation properties, but those having conductivity can also be electrically insulated from the wiring by interposing an insulating film. Examples of the material of the base of the wiring substrate include ceramics such as aluminum oxide, aluminum nitride, or a mixture of them; metals such as copper, iron, nickel, chromium, aluminum, silver, gold, titanium, or an alloy thereof; and resins such as an epoxy resin, a BT resin, a polyimide resin, or a fiber-reinforced resin (a reinforcer is glass). The wiring substrate to be used can be a rigid substrate or a flexible substrate (flexible substrate) depending on the material and thickness of the base. The wiring substrate is not limited to a flat plate-like form and can take a form including a recessed portion like the above package.

The wiring is formed on at least an upper surface of the base, and also may be formed in the interior of the base, or formed on a lower surface or the side surface of the base. The wiring may also include a land (die pad) portion with which a semiconductor element is bonded, a terminal portion for external connection, a lead-out wiring portion for connecting them. Examples of the material of the wiring include copper, nickel, palladium, rhodium, tungsten, chromium, titanium, aluminum, silver, gold, or an alloy thereof. From the viewpoint of heat radiation properties, copper or a copper alloy is preferable. A surface layer thereof may be provided with a plating or light reflecting film made of silver, aluminum, rhodium, gold, copper, or an alloy thereof. Among them, silver having good light reflectivity is preferable. These wirings can be formed by a method of electroplating, electroless plating, sputtering, deposition, printing, coating, co-firing, post-firing, or the like.

(Semiconductor Element 20)

The semiconductor element includes at least a semiconductor element structure, and further includes a substrate in many cases. The semiconductor element may be not only the light emitting element, but also a light receiving element, or an electronic element. Examples of the light emitting element include a light emitting diode (LED), a semiconductor laser (LD), and the like. Examples of the light receiving element include a photodiode, a solar battery, and the like. Examples of the electronic element include a diode (non-light transmitting diode), a transistor, an IC, a LSI, and the like. The top surface shape of the semiconductor element is preferably a quadrilateral shape, especially, a square, or a rectangular one of which is longer in one direction, but may be other shapes. The side surface of the semiconductor element (especially, substrate) maybe substantially perpendicular to its upper surface, or inclined inward or outward. The semiconductor element may have a structure with both of p and n electrodes on the same surface side, or have a counter-electrode (vertical electrode) structure with p and n electrodes independently provided the upper and lower surfaces of the element, respectively. The semiconductor element having the structure with both p and n electrodes on the same surface side is configured to have the respective electrodes connected to a lead electrode or a wiring via wires (face-up mount), or each electrode is connected to a lead electrode or a wiring via a conductive adhesive member (flip chip (face-down) mounting). The semiconductor element having the counter-electrode structure has a lower surface electrode bonded to the lead electrode or wiring via a conductive bonding member, and an upper surface electrode connected to the other lead electrode or wiring via the wires. The number of the semiconductor elements mounted on one semiconductor device may be one or plural. The semiconductor elements can be connected in series or in parallel.

(Substrate)

The substrate may be a substrate for crystal growth that allows the growth of crystals of a semiconductor forming the semiconductor element structure, or may be a substrate for bonding that is bonded to a semiconductor element structure separated from the substrate for crystal growth. The substrate has translucency, whereby flip chip mount is easily employed and also light extraction efficiency is easily enhanced. The substrate has electrical conductivity, whereby a vertical electrode structure is easily employed, which easily feeds electric power to the semiconductor element structure uniformly in the plane thereof, leading to an improvement in power efficiency with ease. Examples of the base material of the substrate for crystal growth include sapphire, spinel, gallium nitride, aluminum nitride, silicon, silicon carbide, gallium arsenide, gallium phosphorus, indium phosphorus, zinc sulfide, zinc oxide, zinc selenide, diamond, and the like. The substrate for bonding is preferably a light shielding substrate. The light shielding substrate is often good in thermal conductivity and easily enhances heat radiation properties of the semiconductor element. Specifically, it is possible to use silicon, silicon carbide, aluminum nitride, copper, copper-tungsten, gallium arsenide, ceramics, and the like. If there exists a junction layer capable of suppressing advancing of light from the semiconductor element structure into the substrate interior, the substrate can be selected while thermal conductivity and conductivity are preferentially taken into account as compared with optical characteristics. The thickness of the substrate is, for example, 20 μm or more and 1,000 μm or less, and preferably 50 μm or more and 500 μm or less, from the viewpoint of the strength of the substrate and the thickness of the semiconductor device.

(Semiconductor Element Structure)

The semiconductor element structure can have a light emitting element structure, a light receiving element structure, or an electron element structure. The semiconductor element structure includes a laminate of semiconductor layers, that is, at least an n-type semiconductor layer and a p-type semiconductor layer. The laminate of semiconductor layers preferably includes an active layer intervening between the n-type semiconductor layer and the p-type semiconductor layer. Further, the semiconductor element structure may include an electrode and a protective film. The electrode can be formed of, e.g., gold, silver, tin, platinum, rhodium, titanium, aluminum, tungsten, palladium, nickel, or an alloy thereof. The protective film can be formed of an oxide or nitride of at least one kind of element selected from the group consisting of silicon, titanium, zirconium, niobium, tantalum, and aluminum. When the semiconductor element is a light emitting element or a light receiving element, the light emission wavelength or light reception wavelength of the semiconductor element structure can be selected from an ultraviolet range to an infrared range according to the semiconductor materials or the mixture ratio thereof. A semiconductor material for use is preferably a nitride semiconductor (mainly represented by the following formula: $In_xAl_yGa_{1-x-y}N$, $0 \le x$, $0 \le y$, $x+y \le 1$) which can emit light having a short wavelength and can realize an electronic device of an high frequency and high temperature operation, and also which enables efficient excitation of the phosphor and is a material which can achieve a high efficient solar battery. In addition, the semiconductor materials for use can include InAlGaAs semiconductor, InAlGaP semiconductor, zinc sulfide, zinc selenide, silicon carbide, and the like.

(Metal Film)

A metal film may be provided on a lower surface of a substrate of a semiconductor element (surface of a side opposite to the side where the semiconductor element structure is provided). Materials for the metal film for use can include, e.g., gold, silver, tin, rhodium, tungsten, nickel, molybdenum, platinum, palladium, titanium, or an alloy thereof. The metal film may be a single-layer film or a multi-layer film. Formation methods of the metal film are not particularly limited, but can include sputtering, vapor deposition, and the like. The metal film may be omitted.

(Adhesive Member 30)

An adhesive member is a member for fixing a semiconductor element to a base body. Particularly, the adhesive member is preferably capable of efficiently extracting light emitted from the semiconductor element out of the device because of having translucency, but is not limited thereto. It is possible to use, as the base material of the electrically insulating adhesive member, an epoxy resin, a silicone resin, a polyimide resin, an urethane resin, a melamine resin, a urea resin, an unsaturated polyester resin, an alkyd resin, a bismaleimide resin, or a modified or hybrid resin thereof. Among them, an epoxy resin, a silicone resin, or a modified or hybrid resin thereof is preferable as the base material of the adhesive member because of good translucency, when translucency is required. More specifically, an acid anhydride curing epoxy resin, a cation curing epoxy resin, an addition type silicone resin, or a modified or hybrid resin thereof is preferable. In order to improve thermal conductivity and the like, the adhesive member may contain a filler such as metal, metal oxide, or metal nitride in these resins. It is possible to use, as the conductive adhesive member, a metal paste containing a metal powder of silver, gold, copper, platinum, aluminum, or palladium, and a resin binder; a tin-bismuth based, tin-copper based, tin-silver based, or gold-tin based solder; and a brazing filler metal such as a low melting point metal. It is also possible to use, as the conductive adhesive member, a silver particle sintered paste containing silver particles and/or silver oxide particles, and an organic solvent such as a lower alcohol (see, for example, WO 2009/090915 A)

(Sealing Member 50)

The sealing member is a member for sealing the semiconductor element, the wire, and parts of the wiring or the lead electrode to protect them against dust or external force. The sealing member preferably has electrical insulating properties. Further, the sealing member can preferably allow light emitted from the semiconductor element structure or light received from the outside of the device to pass therethrough (preferably, to have its transmittance of 70% or more). When the semiconductor element is an electronic element, the sealing member may be integrally formed with the above-mentioned molded body or base. Specifically, base materials for the sealing member include a silicone resin, an epoxy resin, a phenol resin, a polycarbonate resin, an acryl resin, a TPX resin, a polynorbornene resin, or a modified resin thereof, or a hybrid resin containing one or more kinds of these resins. Further, a base material for the sealing member may be glass. Among them, the silicone resin or a modified resin thereof preferably has good resistance to heat and light, and have a little volume contraction after solidification of the resin. In particular, the base material for the sealing member preferably contains a phenyl silicone resin as a principal component. The phenyl silicon resin has good gas barrier properties and tends to suppress the degradation of the wiring or lead electrode due to corrosive gas. The sealing member preferably contains a filler, a phosphor, or the like in the base material, or may not contain them.

(Filler)

It is possible to use, as the filler, a diffusing agent, a colorant, and the like. Specific examples thereof include silica, titanium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black, and the like. Examples of the shape of the filler include a spherical shape, an irregular crushed shape, a needle-like shape, a columnar shape, a plate-like shape (including a scale-like shape), a fiber-like shape, a dendritic shape, and the like (same shall apply to the below-mentioned phosphor). The filler may be either a hollow or porous filler.

(Phosphor 60)

The phosphor absorbs at least a part of a primary light emitted from the semiconductor element structure and then outputs a secondary light with a wavelength different from that of the primary light. The phosphor may be used alone, or two or more phosphors may be used in combination. Specifically, the phosphors can include an yttrium-aluminum-garnet activated by cerium, a nitrogen-containing calcium aluminosilicate activated by europium and/or chromium, a sialon activated by europium, a silicate activated by europium, potassium fluorosilicate activated by manganese, or the like. Accordingly, it is possible to produce a semiconductor device that emits color mixture light (e.g. white light) of visible-wavelength primary light and secondary light, or a semiconductor device that emits visible-wavelength secondary light according to being excited by primary light of ultraviolet light.

(Wire 70)

The wire is a conductive wire for connecting the electrode of the semiconductor element to the lead electrode or wiring. Specifically, the wire for use can be a metal wire made of gold, copper, silver, platinum, aluminum, or an alloy thereof. In particular, a gold wire is preferable because the gold wire is less likely to be broken due to stress from the sealing member and has good heat resistance or the like. To enhance the light reflectivity, at least the surface of the wire may be formed of silver or silver alloy.

(Protection Element 80)

A protection element is, for example, an element for protecting a semiconductor element from static electricity or high voltage surge. Specific protection element is Zener diode. The protection element may be coated with a light reflecting coating member such as a resin containing a white pigment so as to suppress light absorption.

EXAMPLES

Examples of the present invention will be described in detail below. It is apparent that the present invention is not limited to the following Examples.

Example 1

A semiconductor device of Example 1 is an upper surface light emission (top view) type surface mount LED having the structure of the semiconductor device 100 shown in FIG. 1 by way of example. The semiconductor device includes a base body of 5.0 mm in length, 6.5 mm in width, and 1.35 mm in thickness. The base body is provided by integrally forming a molded body made of epoxy resin containing white pigment of titanium oxide and a filler of silica, with a pair of positive and negative lead electrodes made of a copper alloy and having a silver coating on its surface. At the substantially center of the base body, a two-stepped type recessed portion is formed. The recessed portion formed by the molded body has a circular shape viewed from the top surface side with 4.3 mm in diameter and a depth 0.85 mm in depth. The lead electrode has a part of its surface serving as a part of the bottom surface of the recessed portion, and extended toward the outside of the molded body. Such a base body is fabricated by positioning the lead frame in a die, charging material for the molded body into the die, and then curing the material.

At the bottom surface of the recessed portion of the base body, two semiconductor elements are bonded to the lead electrode on a side of the negative electrode via an adhesive member. The respective electrodes of the semiconductor element are connected to both positive and negative lead electrodes via gold wires (having a wire diameter of 25 μm). The semiconductor element is a LED element capable of emitting blue light (having a central wavelength of about 455 nm), and having 460 μm in length, 460 μm in width, and 120 μm in thickness. The semiconductor element has the light emitting element structure including an n-type layer made of a nitride semiconductor, an active layer, and a p-type layer, which are stacked in that order on an upper surface of a sapphire substrate. The adhesive member includes a phenylsilicone resin as a base material, the resin containing particles of zirconium oxide therein. The particles of zirconium oxide have a particle diameter of about 5 nm and are subjected to a surface treatment with a siloxane compound, and are mixed in the amount of 5 by weight based on the resin of the base material.

A protection element, as a Zener diode having a counter electrode structure, of 150 μm in length, 150 μm in width, and 85 μm in thickness is bonded on an upper surface of a lead electrode at a positive electrode side via a conductive adhesive member as a silver paste. An upper surface electrode of the protection element is connected to an upper surface of a lead electrode at the negative electrode side via a wire (the same above).

The sealing member is provided within the recessed portion of the base body to cover the semiconductor elements. The sealing member includes a phenyl silicone resin having a refractive index of 1.53 as a base material, and a phosphor of yttrium-aluminum-garnet (YAG:Ce) activated with cerium and a filler of silica in the resin. The upper surface of the sealing member is substantially the same as that of the base body and is substantially flat (slightly recessed due to curing shrinkage, strictly). Such sealing member is formed by falling the fluid raw material dropwise from a dispenser, and heating and solidifying the material. The phosphor is unevenly distributed at the semiconductor element side (i.e. bottom surface side of recessed portion) in the sealing member.

Figure 8:
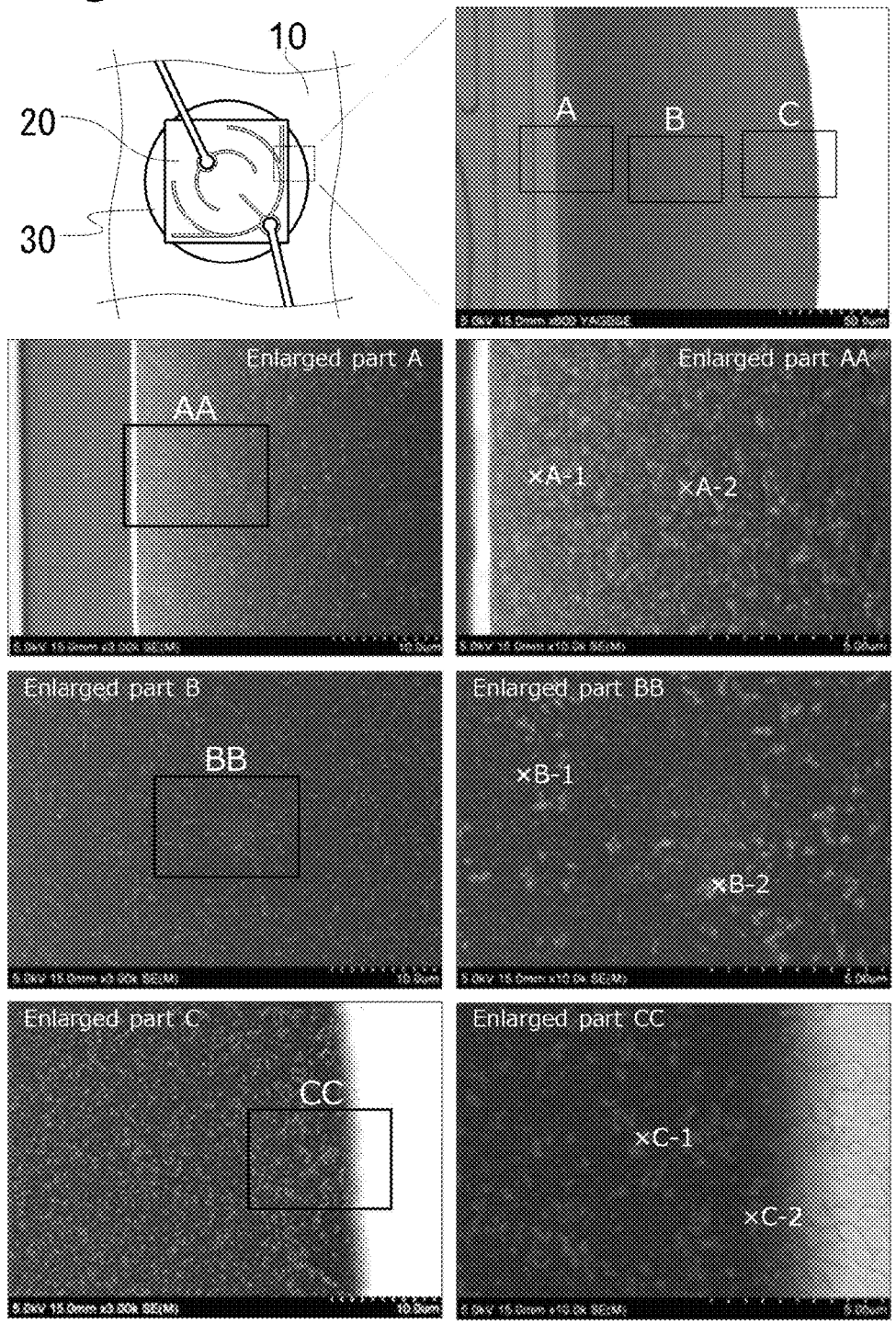
FIG. 8 shows images of an upper surface of a semiconductor device according to one example of the present invention observed by a scanning electron microscope.
Figure 9:
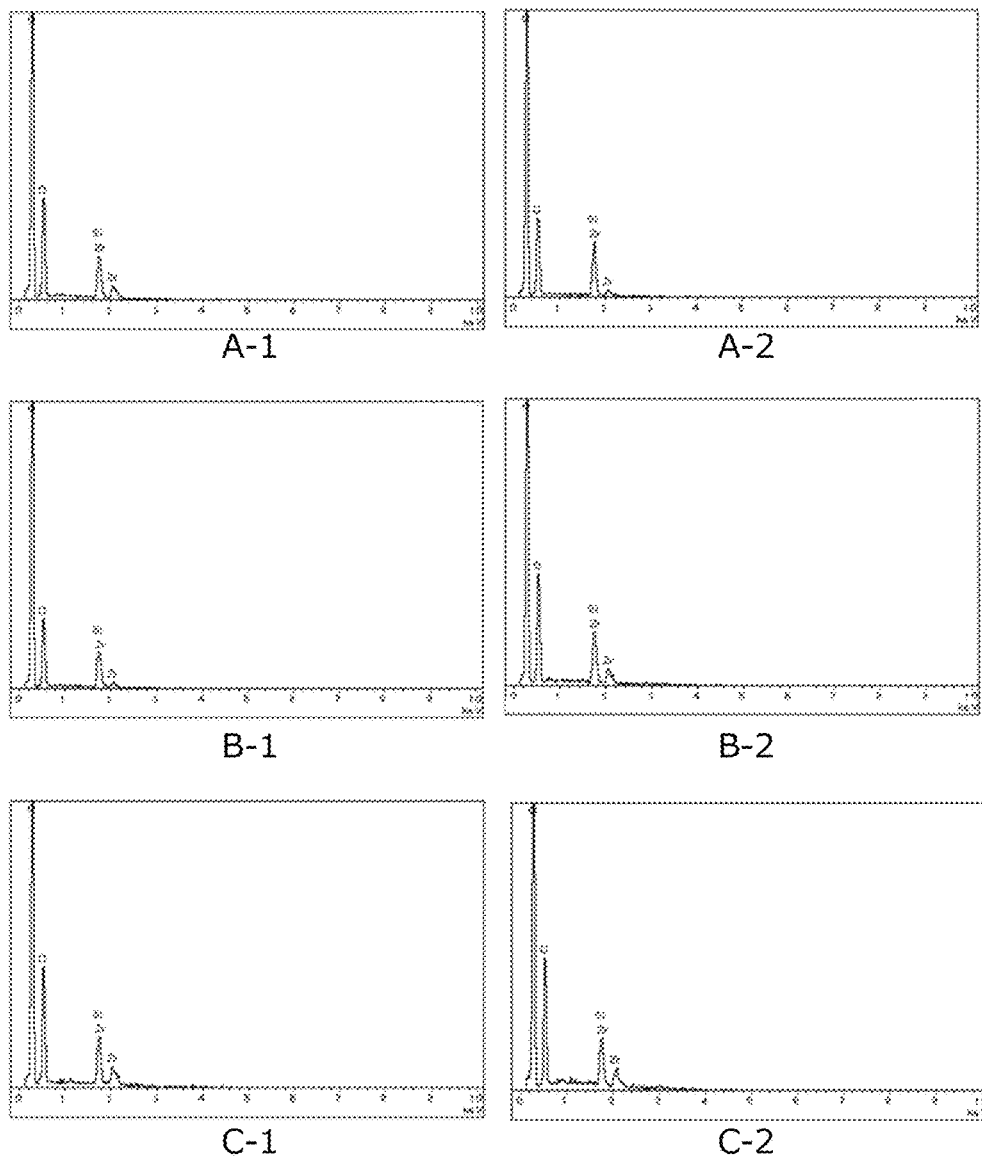
FIG. 9 shows data of energy dispersive X-ray spectrometry of an adhesive member shown in FIG. 8.

FIG. 8 shows images of an upper surface of a semiconductor device according to Example 1 of the present invention observed by a scanning electron microscope (S-4800, manufactured by Hitachi, Ltd.). FIG. 9 shows data of energy dispersive X-ray spectrometry (EDX) of an adhesive member shown in FIG. 8. As shown in FIGS. 8 and 9, at least a part of the marginal portion of the adhesive member is a region where at least either of particles of zirconium oxide or an aggregate of the particles are/is unevenly distributed. As shown in the same drawings, at least a part of the creep-up portion to the side surface of the semiconductor element of the adhesive member is a region where at least either of particles of zirconium oxide or an aggregate of the particles are/is unevenly distributed.

The semiconductor device having the above-mentioned structure of Example 1 can exert the same effect as that of the semiconductor device 100 of the first embodiment. The semiconductor device of Example 1 can maintain the same values as those of luminous flux and adhesive strength (die shear strength) of the semiconductor element even when compared with the semiconductor device having the same structure except that the adhesive member is not mixed with particles of zirconium oxide.

The semiconductor device according to the embodiment of the present invention can be applied to a backlight source of a liquid crystal display, various illumination tools, a large-sized display, various types of display devices dedicated for advertisement, destination guidance, etc., a projector device, and further image readers, such as a digital video camera, a fax machine, a copy machine, or a scanner, various sensors, and the like. The semiconductor device according to the present invention can also be applied to various electronic calculators, such as a personal computer, circuit substrates mounted on the calculator, and the like.

What is claimed is:

1. A semiconductor device comprising:
a base body having lead electrodes, and a semiconductor element bonded on the base body via an adhesive member, the semiconductor element having a p-electrode and an n-electrode on a same upper side surface, the p-electrode being connected to one of the lead electrodes via a first wire, the n-electrode being connected to the other one of the lead electrodes via a second wire,
wherein the adhesive member contains particles selected from a group of (i) surface-treated particles and (ii) particles that coexist with a dispersing agent,
wherein the particles have a particle diameter of 5 nm or more and 50 nm or less,
wherein the adhesive member includes:
a marginal portion having a concave meniscus end provided in contact with the base body, at least an end part of the marginal portion is a first region where the particles exist in high density; and
a creep-up portion formed by creeping-up a side surface of the semiconductor element, at least a part of the creep-up portion is a second region where particles exist in high density.

2. The semiconductor device according to claim 1, wherein the particles are nanoparticles.

3. The semiconductor device according to claim 1, wherein the content of particles in the adhesive member is 0.1% by weight or more and 50% by weight or less.

4. The semiconductor device according to claim 1, wherein the content of particles in the adhesive member is 1% by weight or more and 20% by weight or less.

5. The semiconductor device according to claim 1, wherein the particles exist at an outer periphery of the adhesive member.

6. The semiconductor device according to claim 1, wherein a base material of the adhesive member is selected from a group of an epoxy resin, a silicone resin, a modified resin thereof and a hybrid resin thereof, and wherein a material of the particles is selected from a group of silicon oxide, aluminum oxide, zirconium oxide and titanium oxide.

7. The semiconductor device according to claim 1, wherein a material of the particles is selected from a group of aluminum oxide, aluminum nitride, boron nitride and silicon nitride.

8. The semiconductor device according to claim 1, wherein a longest distance between a side surface of a semiconductor element and a marginal portion of the adhesive member viewed from the top surface side is 50% or less of a longest size of the semiconductor element.

9. The semiconductor device according to claim 1, wherein a region of the adhesive member that the particles are unevenly distributed is half or more of the marginal portion of the adhesive member.

10. The semiconductor device according to claim 1, wherein a half or more of the creep-up portion of the adhesive member is the region where particles are unevenly distributed.

11. The semiconductor device according to claim 1, wherein the semiconductor element is a light emitting element, and
wherein the adhesive member has translucency.

12. The semiconductor device according to claim 1, further comprising a sealing member sealing the semiconductor element,
wherein the semiconductor element is a light emitting element, and
wherein the sealing member contains phosphor particles that are unevenly distributed at the semiconductor element side.

13. The semiconductor device according to claim 12, wherein the phosphor particles contain fluoride phosphor particles.

14. The semiconductor device according to claim 2, wherein the content of particles in the adhesive member is 1% by weight or more and 20% by weight or less.

15. The semiconductor device according to claim 14, wherein a longest distance between a side surface of a semiconductor element and a marginal portion of the adhesive member viewed from the top surface side is 50% or less of a longest size of the semiconductor element.

16. The semiconductor device according to claim 15, wherein the semiconductor element is a light emitting element, and
wherein the adhesive member has translucency.

17. The semiconductor device according to claim 16, wherein a base material of the adhesive member is selected from a group of an epoxy resin, a silicone resin, a modified resin thereof and a hybrid resin thereof, and wherein a material of the particles is selected from a group of silicon oxide, aluminum oxide, zirconium oxide and titanium oxide.

18. The semiconductor device according to claim 16, wherein a material of the particles is selected from a group of aluminum oxide, aluminum nitride, boron nitride and silicon nitride.

19. The semiconductor device according to claim 1, wherein the concave meniscus end is in direct contact with the base body, the concave meniscus end includes the first region where the particles exist in high density.

20. The semiconductor device according to claim 1, wherein the first region where particles exist in high density is situated at an outer periphery of the adhesive member in a top plan view.

21. The semiconductor device according to claim 1, wherein, in the marginal portion, the particles exist in high density on an outermost periphery of the adhesive member in a top plan view.

22. A semiconductor device comprising:
a base body having lead electrodes, and a semiconductor element bonded on the base body via an adhesive member, the semiconductor element having a p-electrode and an n-electrode on a same upper side surface, the p-electrode being connected to one of the lead electrodes via a first wire, the n-electrode being connected to the other one of the lead electrodes via a second wire,
wherein the adhesive member contains particles selected from a group of (i) surface-treated particles and (ii) particles that coexist with a dispersing agent,
wherein the particles have a particle diameter of 5 nm or more and 50 nm or less,
wherein the adhesive member includes in a thickness direction thereof:
a marginal portion having a concave meniscus end provided in contact with the base body, at least a part of the marginal portion is a first region where the particles exist in high density;
a creep-up portion formed by creeping-up a side surface of the semiconductor element, at least a part of the creep-up portion is a second region where particles exist in high density; and
an intermediate surface layer portion between the marginal portion and the creep-up portion where the particles exist in low density.

* * * * *